United States Patent [19]
Nomoto

[11] Patent Number: 6,133,603
[45] Date of Patent: Oct. 17, 2000

[54] MEMORY DEVICE AND MEMORY ARRAY

[75] Inventor: Kazumasa Nomoto, Kanagawa, Japan

[73] Assignee: Sony Corporation, Tokyo, Japan

[21] Appl. No.: 09/207,030

[22] Filed: Dec. 8, 1998

[30] Foreign Application Priority Data

Dec. 9, 1997 [JP] Japan ..................................... 9-339052

[51] Int. Cl.$^7$ ................................................. H01L 29/788
[52] U.S. Cl. .......................................... 257/315; 257/321
[58] Field of Search .................................... 257/321, 315, 257/317

[56] References Cited

U.S. PATENT DOCUMENTS 5,463,235  10/1995  Ishii .
5,604,357   2/1997  Hori .

*Primary Examiner*—Stephen D. Meier
*Attorney, Agent, or Firm*—Hill & Simpson

[57] ABSTRACT

It is made possible to conduct writing and erasing information at high speed and with a low gate voltage, attain high integration with reduced power dissipation, and retain information accurately. It is also made possible to change the conductivity of a conduction layer efficiently depending on whether there are accumulated charges or not, even if the device is made finer. A barrier layer, a transition layer, a barrier layer, a transition layer, a barrier layer, a charge accumulation layer and a barrier layer are stacked one after another on a conduction layer to cause transition of charges in the conduction layer to the charge accumulation layer by resonance tunneling. In the conduction layer, one insulation portion and one insulation portion allowing charge tunneling are formed with the barrier layer in between. The capacitance of the insulation portions is made smaller than $e^2/k_B T$ (where e is the electric prime quantity, $k_B$ is the Boltzmann's constant, and T is operation temperature). The conduction layer, the transition layers, and the charge accumulation layer are made of Si. The barrier layers are made of $SiO_2$ so that the electron affinity is made large, and small alternately.

12 Claims, 14 Drawing Sheets

MEMORY DEVICE AND MEMORY ARRAY

BACKGROUND OF THE INVENTION

1. Field of the Invention

The present invention relates to a memory device for recording information by accumulating charges in a charge accumulation layer and a memory array formed by integrating the memory devices.

2. Description of the Related Art

A conventional memory device represented by an EEPROM (Electrically Erasable and Programmable Read Only Memory) or a flash memory has a charge accumulation layer for accumulating charges (i.e., electrons or holes) surrounded by an insulating film such as a $SiO_2$ (silicon dioxide) film between a gate electrode and a substrate of a MOS (Metal-Oxide-Semiconductor) transistor. In the memory device, when a high voltage is applied between a source electrode and a drain electrode thereof and a high voltage is applied to the gate electrode, charges are conducted through the insulating film according to tunnel effect and accumulated in the charge accumulation layer and a difference in the number of charges accumulated is retained as a difference in information. The retained information can be read out by using the fact that the magnitude of a current flowing between the source electrode and the drain electrode changes according to the number of charges accumulated in the charge accumulation layer.

In the conventional memory device, however, the charge accumulation layer is surrounded by an insulating film of a single layer. For making the information retaining time sufficiently long, therefore, the insulating film has to be made thick so as to have a thickness in the range of, for example, approximately 10 to 20 nm. For writing and erasing information practically, therefore, a large gate voltage of at least 10 V has to be applied which results in hindering implementation of finer devices.

Furthermore, if the conventional memory device is made finer, the short channel effect occurs in the same way as the field effect transistor. It is thus expected that the conductivity of the conduction layer does not change efficiently between the case where charges are accumulated in the charge accumulation layer and the case where charges are not accumulated therein. The conventional memory device had such a problem.

Furthermore, in the conventional memory device, whereas a large gate voltage has to be applied for writing or erasing the information, even a small gate voltage causes some charge conduction and changes the number of charges accumulated in the charge accumulation layer. In a memory array formed by integrating a plurality of memory devices, therefore, the following problem also occurs: even if writing and reading information are conducted for one memory device, then some charge conduction also occurs in memory devices located in the vicinity thereof, and consequently retained information is disturbed.

OBJECT AND SUMMARY OF THE INVENTION

In view of the above described problems, the present invention has been made. An object of the present invention is to provide a memory device capable of writing and erasing information at high speed and with a low gate voltage, conducting high integration with reduced power dissipation, changing conductivity of the conduction layer depending upon whether there are accumulated charges or not, even if the memory device is made finer, and retaining the information accurately, and to provide a memory array formed by integrating such memory devices.

A memory device according to the present invention includes a conduction layer having a plurality of insulation portions allowing charge tunneling, a charge accumulation layer for accumulating charges transited from the conduction layer, one or more transition layers for transiting charges from the conduction layer to the charge accumulation layer, formed between the charge accumulation layer and the conduction layer, and a plurality of barrier portions allowing charge tunneling, being respectively formed between one of the transition layers and the conduction layer, between the transition layers, and one of the transition layers and the charge accumulation layer.

A memory array according to the present invention is obtained by integrating memory devices of the present invention.

In the memory device according to the present invention, when a voltage is applied between the conduction layer and the charge accumulation layer in a forward direction, charges in the conduction layer transit to the charge accumulation layer via the transition layers. Thereby, charges are accumulated in the charge accumulation layer, and information is retained. This information can be read out since the value of a current flowing through the conduction layer varies depending on whether charges are accumulated in the charge accumulation layer or not. Also when a voltage is applied between the conduction layer and the charge accumulation layer in a reverse direction, the charges accumulated in the charge accumulation layer transit to the conduction layer via the transition layers. Thereby, the information is erased. Since the transition of charges between the conduction layer and the charge accumulation layer is conducted via the transition layers, writing and erasing information can be conducted at high speed and with low power. Furthermore, since the conduction layers has a plurality of insulation portions, the conductivity of the conduction layer changes depending on whether there are charges accumulated in the charge accumulation layer or not.

A memory array according to the present invention uses the memory devices of the present invention. By applying a voltage between the conduction layer and the charge accumulation layer of each memory device, information is written or erased at high speed and with a low voltage. Information reading is conducted by detecting whether there are charges accumulated in the charge accumulation layer or not on the basis of a change in conductivity of the conduction layer of each memory device.

DETAILED DESCRIPTION OF THE PREFERRED EMBODIMENTS

Figure 1:
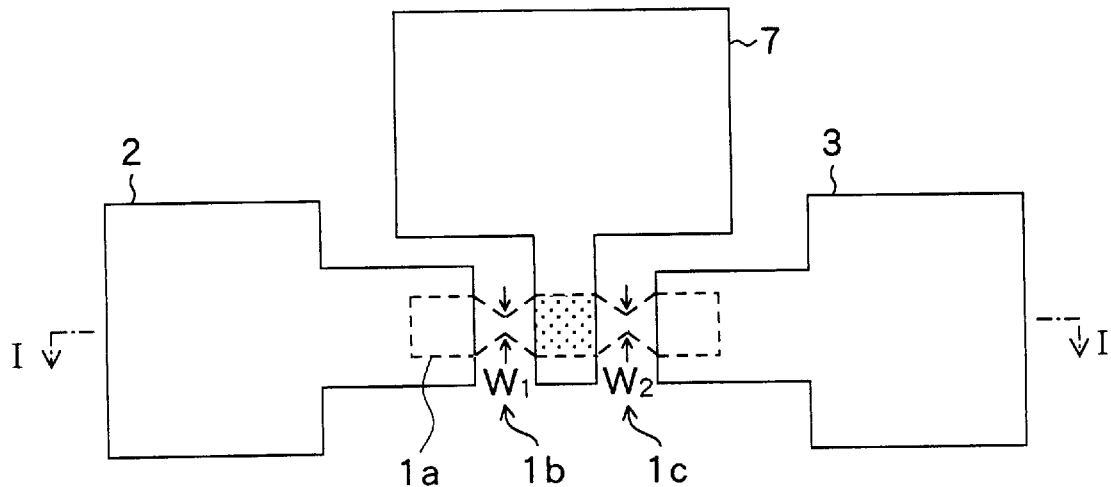
FIG. 1 is a top view showing the configuration of a memory device according to a first embodiment of the present invention.

Hereafter, embodiments of the present invention will be described in detail by referring to the drawings.

First Embodiment

Figure 2:
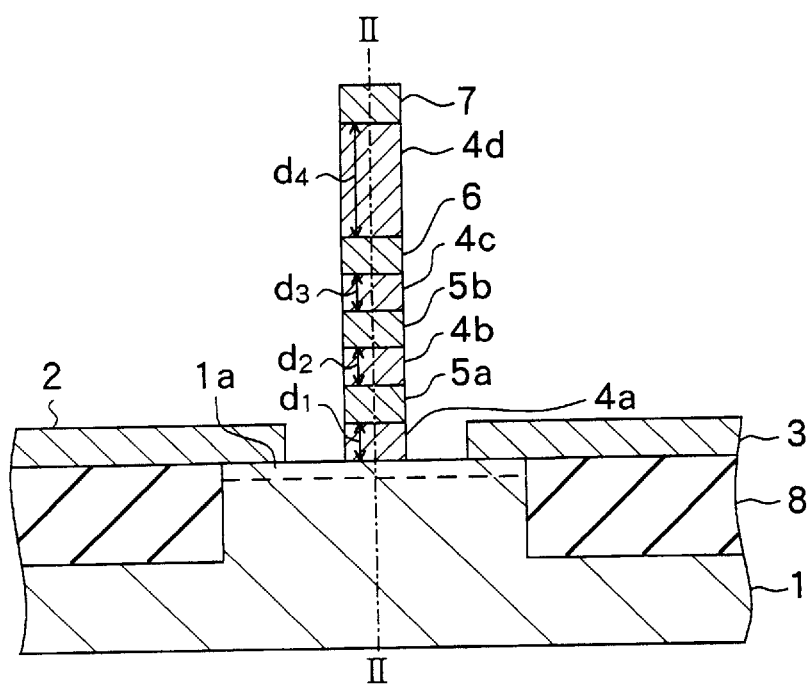
FIG. 2 is a sectional view taken along a line I—I of FIG. 1 showing the configuration of the memory device shown in FIG. 1.

FIG. 1 is a top view of the structure of a memory device according to a first embodiment of the present invention. FIG. 2 shows the section structure of the memory device of FIG. 1 taken along a line I—I of FIG. 1. In this memory device, a source electrode 2 and a drain electrode 3 each made of suitable metal are formed on a suitable substrate 1 so as to have an interval in between. On the top of the substrate 1 between the source electrode 2 and the drain electrode 3, a charge accumulation layer 6 and a barrier layer 4d are stacked via a plurality of barrier layers serving as barrier portions and one or more transition layers each formed between barrier layers (here, three barrier layers 4a, 4b and 4c, and two transition layers 5a and 5b formed in between). Thereon, a gate electrode (control electrode) 7 made of suitable metal is formed. The gate electrode 7 and the barrier layer 4d are in a nonohmic junction state.

On the surface of the substrate 1 between the source electrode 2 and the drain electrode 3, two-dimensional electron gas (2DEG) is accumulated and a conduction layer 1a serving as a current passage is formed. The conduction layer 1a is in an ohmic junction state with each source electrode 2 and drain electrode 3. On the surface of the substrate 1, a device isolation portion 8 for isolating this memory device from other devices is formed so as to surround a predetermined region located between the source electrode 2 and the drain electrode 3. On the surface of the substrate 1 around the conduction layer 1a, a device isolation portion 8 for isolating this memory device from other devices is formed.

In each of portions of the conduction layer 1a located between the source electrode 2 and the barrier layer 4a and located between the drain electrode 3 and the barrier layer 4a, at least one insulation portion is formed. (Here, one insulation portion 1b and one insulation portion 1c are formed.) Each insulation portion has a narrow portion. In a plane parallel to the surface of the substrate 1, the width of the narrow portion corresponding to the length direction of the gate electrode 7 is narrower than that of the other portions Each width $W_1$ and $W_2$ respectively of the insulation portions 1b and 1c is 100 nm or less so that charges may tunnel therethrough owing to the quantum effect. The capacitance $C_{11}$ and $C_{12}$ respectively of the insulation portions 1b and 1c is made smaller than $e^2/k_BT$, where e is the electric prime quantity ($1.6 \times 10^{-19}$ C), $k_B$ the Boltzmann's constant ($1.38 \times 10^{-23}$ J/K), and T is temperature whereat the device is used. An arbitrary number of insulation portions may be formed However, it is desirable that the number of the insulation layers between the source electrode 2 and the barrier layer 4a is equal to the number of the insulation layers between the drain electrode 3 and the barrier layer 4a.

At least the surface (the surface on which the source electrode 2 and so on are formed) of the substrate 1 is made of a suitable semiconductor. For example, a semiconductor substrate made of a suitable semiconductor may be used as the substrate 1. It is also possible to use a substrate obtained by forming a suitable semiconductor thin film on a surface of a substrate main body made of sapphire or suitable glass or plastic, such as a SOI (Silicon-On-Insulator) substrate or a SOS (Silicon-On-Sapphire) substrate. In other words, the conduction layer 1a is made of a suitable semiconductor. Furthermore, the barrier layers 4a, 4b, 4c and 4d, the transition layers 5a, 5b, and the charge accumulation layer 6 are also made of suitable semiconductors respectively.

However, the barrier layer 4a formed between the conduction layer 1a and the transition layer 5a is made of a semiconductor which has a smaller electron affinity or a larger work function than the semiconductor forming the conduction layer 1a (i.e., the substrate 1) and the semiconductor forming the transition layer 5a. Also, the barrier layer 4b formed between the transition layers 5a and 5b is made of a semiconductor which has a smaller electron affinity or a larger work function than the semiconductor forming the transition layer 5a and the semiconductor forming the transition layer 5b. Furthermore, the barrier layer 4c formed between the transition layer 5b and the charge accumulation layer 6 is made of a semiconductor which has a smaller electron affinity or a larger work function than the semiconductor forming the transition layer 5b and the semiconductor forming the charge accumulation layer 6. In addition, the barrier layer 4d formed between the charge accumulation layer 6 and the gate electrode 7 is made of a semiconductor which has a smaller electron affinity or a larger work function than the semiconductor forming the charge accumulation layer 6.

For example, the conduction layer 1a, the transition layers 5a, 5b, and the charge accumulation layer 6 are respectively made of Si (silicon), and the barrier layer 4a, 4b, 4c and 4d are made of $SiO_2$, $Si_3N_4$ (silicon nitride) or SiON. Alternatively the conduction layer 1a, the transition layers 5a, 5b and the charge accumulation layer 6 are made of SiGe or Ge (germanium), and the barrier layer 4a, 4b, 4c and 4d are made of SiGe, Si, SiO$_2$, Si$_3$N$_4$ or SiON. Or the conduction layer 1a, the transition layer 5a, 5b, and the charge accumulation layer 6 are respectively made of a Group III–V compound semiconductor including at least one element selected from the group consisting of In (indium) and Ga (gallium) of Group III element and As (arsenic) of the Group V element, and the barrier layer 4a, 4b, 4c and 4d are respectively made of a Group III–V compound semiconductor including at least one element selected from the group consisting of In, Al (aluminum) and Ga of the Group III element and As of the Group V element. Alternatively, the conduction layer 1a, the transition layer 5, 5b, and the charge accumulation layer 6 are respectively made of a Group III–V compound semiconductor including at least one element selected from the group consisting of In and Ga of the Group III element and Sb (antimony) of the Group V element, and the barrier layer 4a, 4b, 4c and 4d are respectively made of a Group III–V compound semiconductor including at least one element selected from the group consisting of In, Al and Ga of the Group III element and Sb of the Group V element.

Figure 3:
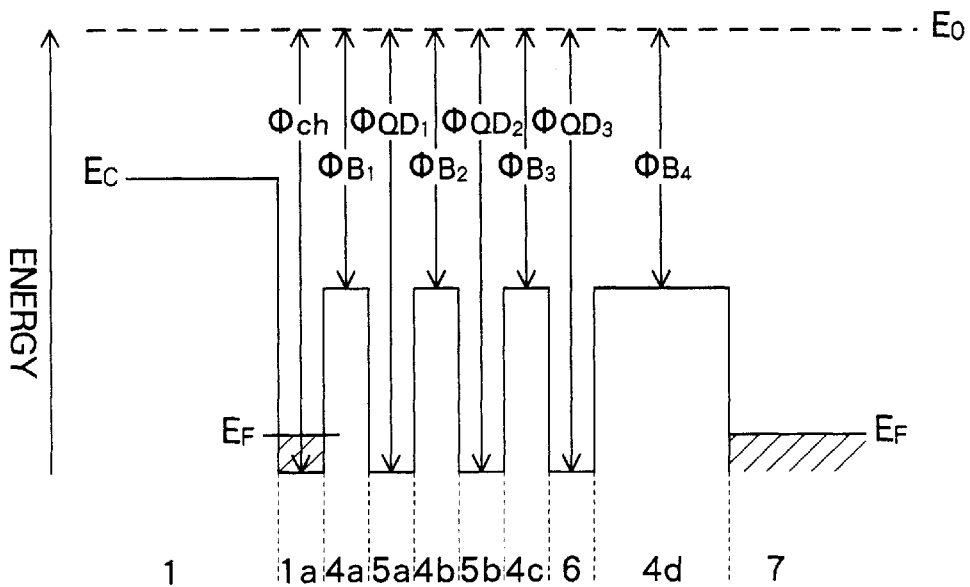
FIG. 3 is an energy band structure diagram taken along a line II—II of FIG. 2 at the time of thermal equilibrium.

When respective layers are made of these semiconductors, the energy band structure of the memory device taken along a line II—II of FIG. 2 becomes as shown in FIG. 3. Here, Ec denotes an energy level at a conduction band end, E$_F$ denotes a Fermi level, and E$_o$. denotes a vacuum level. Furthermore, $\phi_{ch}$ is an electron affinity of a material forming the conduction layer 1a, and $\phi_{B1}$, $\phi_{B2}$, $\phi_{B3}$ and $\phi_{B4}$ are respectively electron affinities of materials forming the barrier layers 4a, 4b, 4c and 4d. In addition, $\phi_{QD1}$ and $\phi_{QD2}$ are respectively electron affinities of materials forming the transition layers 5a and 5b, and $\phi_{QD3}$ is an electron affinity of a material forming the charge accumulation layer 6.

The thickness d$_1$, d$_2$ and d$_3$ of the barrier layers 4a, 4b and 4c are respectively set to such a distance that charges can tunnel (for example, 50 nm or less), and thickness d$_4$ of the barrier layer 4d is set to such a distance that charges cannot tunnel easily (for example, at least 50 nm). Furthermore, the capacitance C$_{41}$, C$_{42}$ and C$_{43}$ respectively of the barrier layers 4a, 4b and 4c are made smaller than e$^2$/k$_B$T.

By the way, the capacitance C is typically inversely proportional to the distance d which is proportional to an area S as represented by expression (1) below. In addition, the thickness d$_1$, d$_2$ and d$_3$ respectively of the barrier layers 4a, 4b and 4c cannot be made thicker than a predetermined value in order to make charges tunnel. In other words, areas S$_1$, S$_2$ and S$_3$ respectively of portions of the barrier layers 4a, 4b and 4c in which tunneling of charges occurs are smaller than e$^2$d$_1$/$\epsilon_1$k$_B$T, e$^2$d$_2$/$\epsilon_2$k$_B$T and e$^2$d$_3$/$\epsilon_3$k$_B$T, respectively, where $\epsilon_1$, $\epsilon_2$ and $\epsilon_3$ are dielectric constants respectively of the barrier layers 4a, 4b and 4c. Here, the areas S$_1$, S$_2$ and S$_3$ where tunneling of charges occurs correspond to an area of contact between the barrier layer 4a and the conduction layer 1a (i.e., an area of a dotted portion in FIG. 1), and are equal to each other.

$$C = \epsilon S/d \quad (1)$$

where $\epsilon$ is the dielectric constant, S is the area, and d is the distance.

For example, it is now assumed that the conduction layer 1a, the transition layer 5a, 5b and the charge accumulation layer 6 are made of Si, and the barrier layer 4a, 4b, 4c and 4d are respectively made of SiO$_2$. It is further assumed that the thickness d$_1$, d$_2$ and d$_3$ of the barrier layers 4a, 4b, 4c and 4d is 10 nm respectively. If in this case the device is used at approximately room temperature of 27° C. (300° K), then the dielectric constants $\epsilon_1$, $\epsilon_2$ and $\epsilon_3$ respectively of the barrier layers 4a, 4b and 4c becomes 3.5×10$^{-11}$ [F/m], and the area of the contact between the barrier layer 4a and the conduction layer 1a (i.e., areas S$_1$, S$_2$ and S$_3$) becomes 1.8×10$^{-15}$ m$^2$. If it is now assumed that the dotted portion in FIG. 1 takes the shape of a square, the length of one side thereof is approximately 42 nm.

Here, the thickness of the transition layers 5a, 5b and the charge accumulation layer 6 also becomes thin, and those layers become quantum box layers. In other words, the barrier layers 4a, 4b, 4c and 4d, the transition layers 5a, 5b and the charge accumulation layer 6 form a multiple quantum box layer allowing mutual quantum tunneling (i.e., coupled quantum box layer). However, the transition layers 5a, 5b and the charge accumulation layer don't have to be thin in thickness, but may be thick.

The memory device having such a configuration operates as described below.

Figure 4:
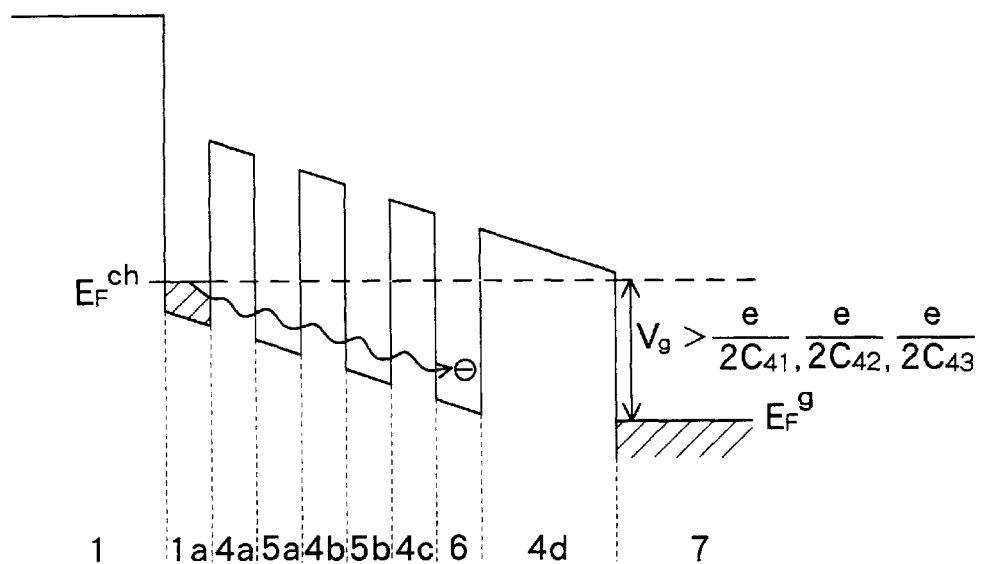
FIG. 4 is an energy band structure diagram for description of writing operation of the memory device of FIGS. 1 and 2.

In this memory device, information is first written by applying a positive gate voltage (control voltage) Vg of forward bias to the gate electrode 4. An energy band structure taken along a line II—II of FIG. 2 at this time is shown in FIG. 4. Here, E$_F^{Ch}$ and E$_F^g$ are Fermi levels of the conduction layer 1a and the gate electrode 4, respectively.

In this memory device, the capacitance C$_{41}$, C$_{42}$ and C$_{43}$ respectively of the barrier layers 4a, 4b and 4c are smaller than e$^2$/k$_B$T. If the gate voltage Vg is smaller than each e/2C$_{41}$, e/2C$_{42}$ and e/2C$_{43}$, therefore, electrons of the conduction layer 1a cannot transit to the charge accumulation layer 6 because of the so-called Coulomb blockade effect (see "Single Charge Tunneling" edited by H. Grabert and M. H. Devoret, Plenum Press, New York, 1992).

Figure 5:
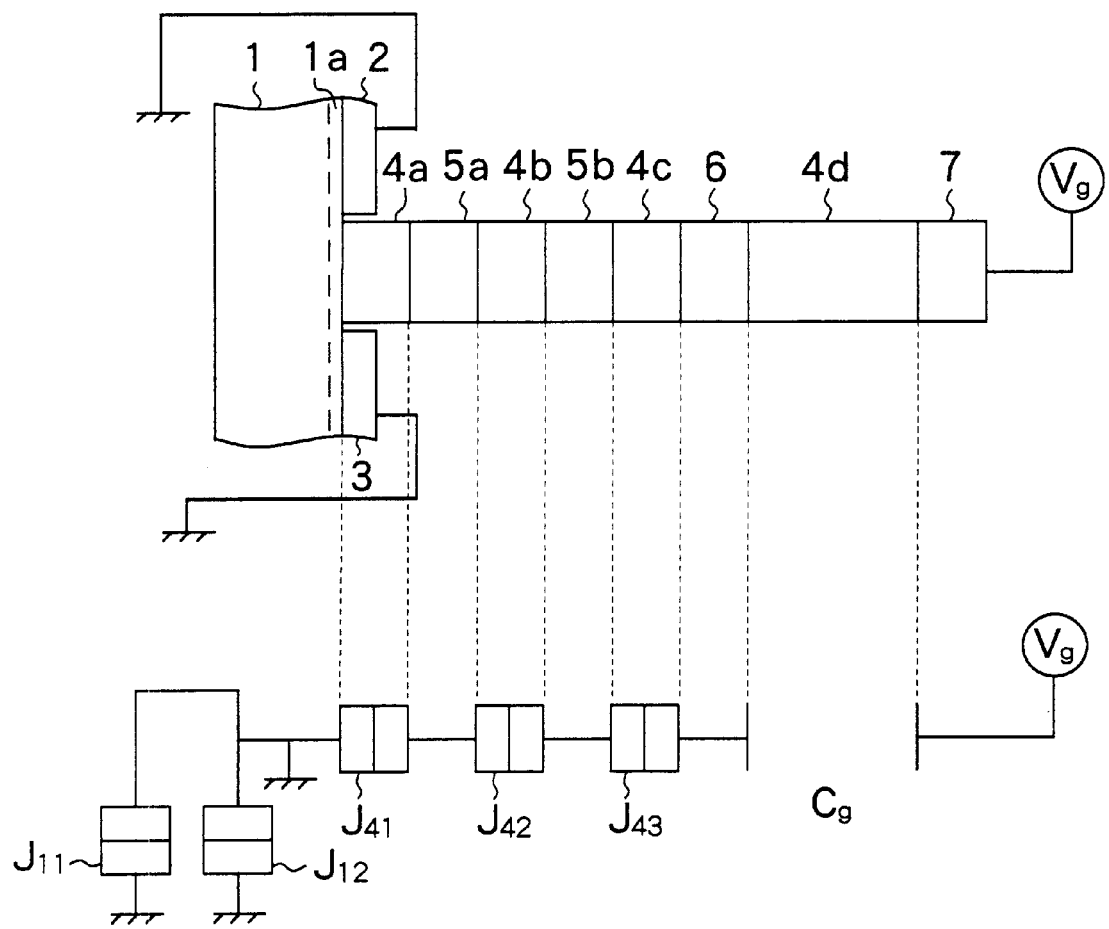
FIG. 5 is a circuit diagram showing an equivalent circuit of the memory device of FIGS. 1 and 2.

If the gate voltage Vg is made larger than each e/2C$_{41}$, e/2C$_{42}$ and e/2C$_{43}$, however, electrons of the conduction layer 1a transit to the charge accumulation layer 6 via the transition layers 5a and 5b as shown in FIG. 4. This transition is caused by resonance tunneling occurring between the conduction layer 1a and the charge accumulation layer 6. Therefore, the transition occurs at extremely high speed. Assuming that this memory device is equivalent to circuit shown in FIG. 5, the writing time at this time becomes (R$_{41}$+R$_{42}$+R$_{43}$) Cg. In the equivalent circuit shown in FIG. 5, J$_{41}$, J$_{42}$ and J$_{43}$ respectively correspond to the barrier layers 4a, 4b and 4c, and are tunnel junctions respectively having tunnel resistances R$_{41}$, R$_{42}$ and R$_{43}$, and capacitance C$_{41}$, C$_{42}$ and C$_{43}$. Furthermore, Cg corresponds to the barrier layer 4d, and is a capacitor having a capacitance Cg. J$_{11}$ and J$_{12}$ respectively correspond to the insulation portions 1b and 1c of the conduction layer 1a, and are tunnel junctions respectively having capacitances C$_{11}$ and C$_{12}$.

For example, if each capacitance C$_{41}$, C$_{42}$ and C$_{43}$ respectively of the barrier layers 4a, 4b and 4c is 4×10$^{-19}$ F, and each tunnel resistance R$_{41}$, R$_{42}$ and R$_{43}$ is 1×10$^{10}$ Ω, then the gate voltage required for writing becomes approximately 0.2 V. As compared with a conventional flash memory requiring the gate voltage in the range of 10 to 20 V, the present memory device operates with an extremely small voltage. Furthermore, if the capacitance Cg of the barrier layer 4d is 1×10$^{-18}$ F, then the time required for writing becomes 30 ns, and the memory device thus operates at high speed.

Figure 6:
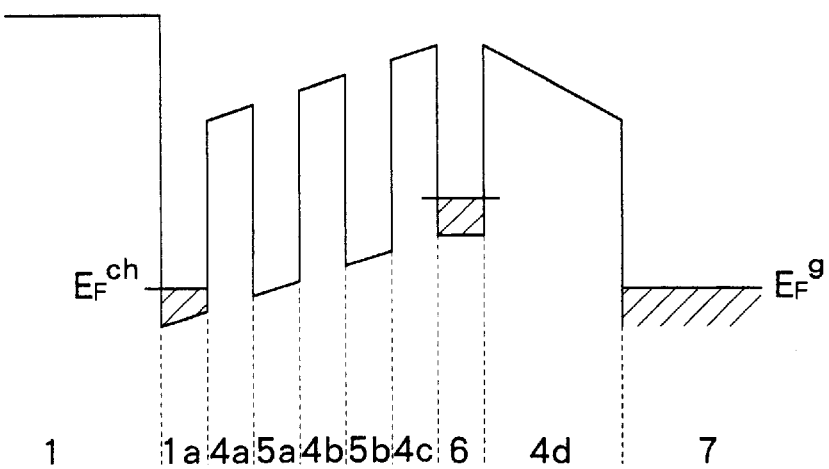
FIG. 6 is an energy band structure diagram for description of writing operation of the memory device of FIGS. 1 and 2.

Subsequently, the gate voltage Vg is returned to zero. An energy band structure taken along a line II—II of FIG. 2 is shown in FIG. 6. In this way, it becomes difficult for electrons accumulated in the charge accumulation layer 6 to transit to the conduction layer 1a because of the Coulomb blockade effect. Here, the resistance occurring when the electrons accumulated in the charge accumulation layer 6 transit to the conduction layer 1a is approximately $R_K$ ($R_{41}/R_K$) ($R_{42}/R_K$) ($R_{43}/R_K$), and the electron retaining time in the charge accumulation layer 6 becomes approximately $R_K$ ($R_{41}/R_K$) ($R_{42}/R_K$) $R_{43}/R_K$) Cg. BY the way, $R_K$ is quantum resistance (approximately 13 k Ω).

For example, if the tunnel resistance $R_{41}$, $R_{42}$ and $R_{43}$ respectively of the barrier layers 4a, 4b and 4c is $1 \times 10^{10}$ Ω and the capacitance Cg of the barrier layer 4d is $1 \times 10^{-18}$ F, then the electron retaining time becomes approximately $6 \times 10^4$ S. In other words, the electrons accumulated in the charge accumulation layer 6 are retained in a non-volatile manner.

Figure 7:
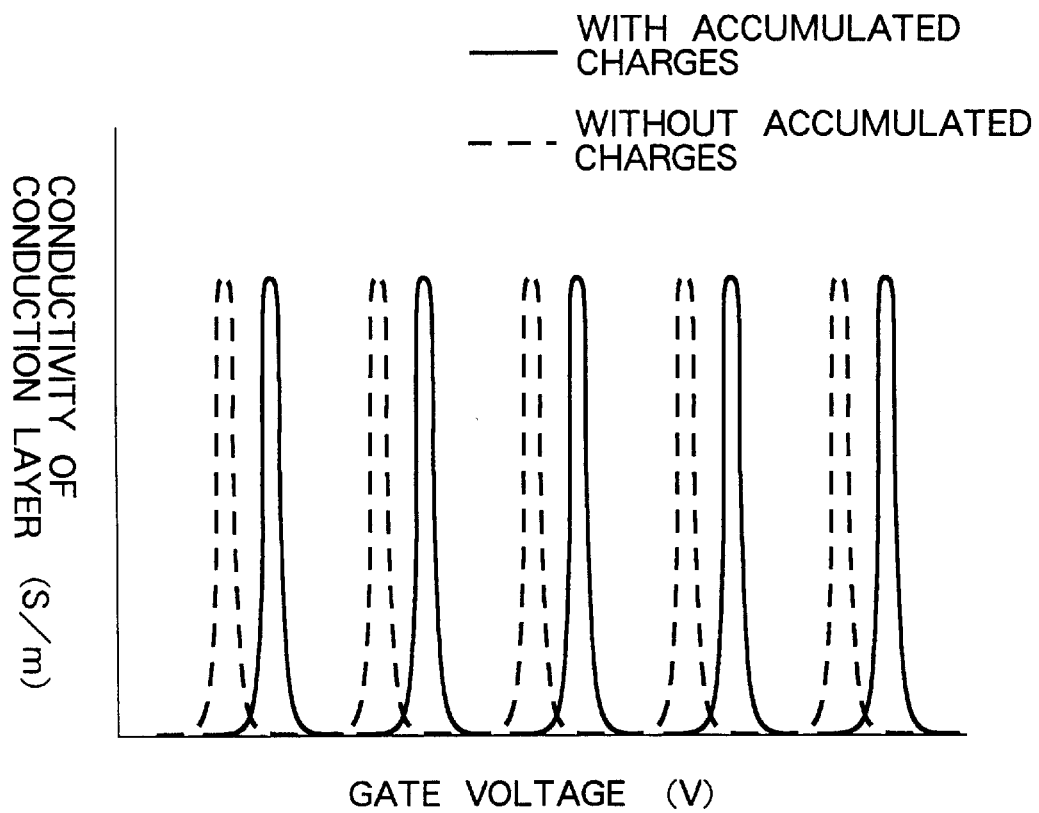
FIG. 7 is a characteristic diagram showing the relation between the gate voltage Vg of the memory device of FIGS. 1 and 2 and the conductivity of the conduction layer.

Information thus written is read out by measuring the value of a current flowing through the conduction layer 1a and detecting its change. In this memory device, the insulation portions 1b and 1c respectively having capacitance $C_{11}$ and $C_{12}$ each smaller than $e^2/k_B T$ are formed in the conduction layer 1a. Therefore, the conductivity of the conduction layer 1a changes with respect to the gate voltage Vg as shown in FIG. 7. In other words, the conductivity of the conduction layer 1a repeats increase and decrease at intervals of $e/(Cg+C_{11}+C_{12})$ as the gate voltage Vg is increased. The position of the change curve is shifted depending upon whether there are charges accumulated in the charge accumulation layer 6 or not. Accordingly, the amount of the change in the conductivity of the conduction layer 1a at the same gate caused by presence or absence of the charges accumulated in the charge accumulation layer 6 becomes large. By measuring the change of the current flowing through the conduction layer 1a, therefore, it can be determined whether there are charges accumulated in the charge accumulation layer 6 or not, and information is read out easily.

Figure 8:
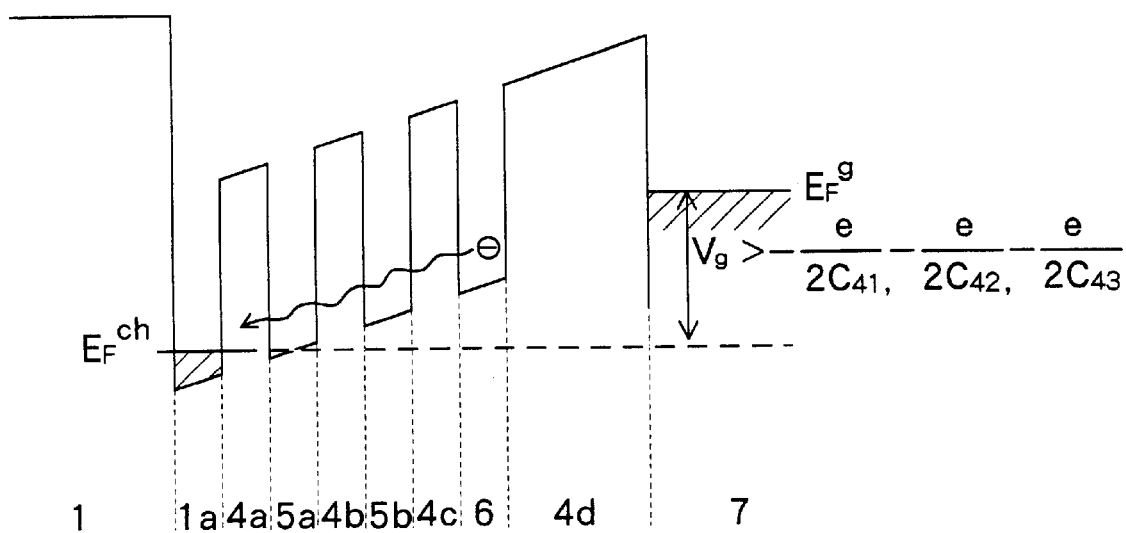
FIG. 8 is an energy band structure diagram for description of erasing operation of the memory device of FIGS. 1 and 2.

Furthermore, the information thus written is erased by applying a negative gate voltage Vg of reverse bias to the gate electrode 7 as shown in FIG. 8. If the gate voltage Vg is made larger than each $-e/2C_{41}$, $-e/2C_{42}$ and $-e/2C_{43}$, then the electrons accumulated in the charge accumulation layer 6 transit to the conduction layer 1a via the transition layers 5a and 5b according to the Coulomb blockade effect in this case as well. This transition is caused by resonance tunneling occurring between the conduction layer 1a and the charge accumulation layer 6 in the same way as the writing operation. Therefore, the transition occurs at extremely high speed. Even if the gate voltage Vg is returned to zero thereafter, the possibility that the electrons will transit from the conduction layer 1 to the charge accumulation layer 6 is extremely small because of the Coulomb blockade effect.

Such memory devices are integrated by using a circuit architecture such as the NAND system, NOR system, or AND system, and used as a memory array.

Such a memory device can be fabricated as described below. It is now assumed that a single crystal Si substrate is used as the substrate 1 and the barrier layer 4a, 4b, 4c and 4d are respectively made of $SiO_2$. It is further assumed that the transition layer 5a, 5b and the charge accumulation layer 6 is respectively made of polycrystal Si and the source electrode 2, the drain electrode 3 and the gate electrode 7 are respectively made of Al. The fabrication method in this case will now be described specifically.

Figure 9A:
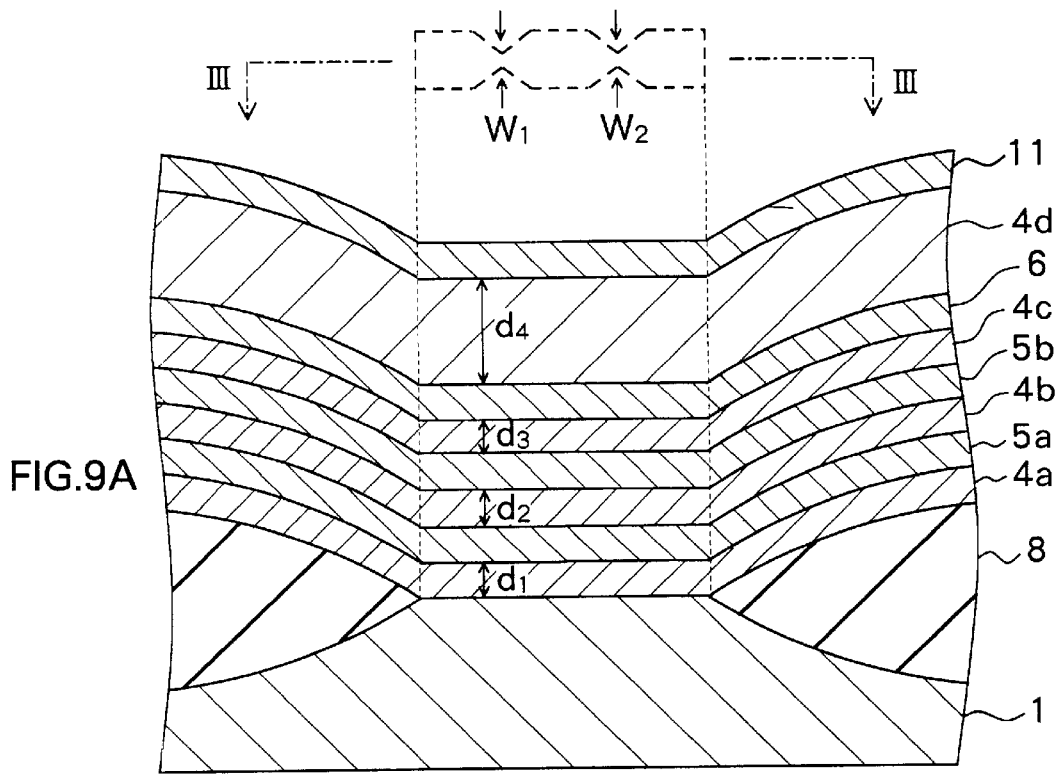
FIGS. 9A and 9B are sectional views showing steps in a fabrication method of the memory device of FIGS. 1 and 2.

FIGS. 9 and 10 show respective fabrication steps thereof. In FIG. 9A, a top view and a sectional view taken along a line III—III thereof are shown together.

First, on a suitable substrate 1 made of single crystal Si as shown in FIG. 9A, a region forming a device isolation portion (i.e., a region around a rectangle represented by a broken line in FIG. 9A) is selectively oxidized by using, for example, the LOCOS (Local Oxidation of Silicon) method. A device isolation portion 8 is thus formed. At this time, the widths $W_1$ and $W_2$, in the length direction of the gate electrode 7, of portions of the region for forming conduction layer surrounded by the device isolation portion 8, respectively corresponding to the insulation portions 1b and 1c is made to become 100 nm or less.

Subsequently, on the substrate 1 having the device isolation portion 8 formed thereon, a barrier layer 4a having a thickness of $d_1$ made of $SiO_2$, a transition layer 5a having a suitable thickness made of polycrystal Si, a barrier layer 4b having a thickness of $d_2$ made of $SiO_2$, a transition layer 5b having a suitable thickness made of polycrystal Si, a barrier layer 4c having a thickness of $d_3$ made of $SiO_2$, a charge accumulation layer 6 having a thickness of $d_4$ made of $SiO_2$ are stacked one after another as shown in FIG. 9A by using, for example, the PECVD Plasma Enhanced Chemical Vapor Deposition) method, sputtering method, or thermal oxidation method. Here, the thickness $d_1$, $d_2$ and $d_3$ respectively of the barrier layers 4a, 4b and 4c are made to be, for example, 50 nm or less to facilitate tunneling of electrons. The thickness $d_4$ of the barrier layer 4d is made to be, for example, at least 50 nm so that electrons may not tunnel easily.

Subsequently, as shown in FIG. 9A, Al is deposited on the barrier layer 4d by using, for example, the sputtering method. A gate electrode forming layer 11 to form a gate electrode 7 is thus formed.

Figure 9B:
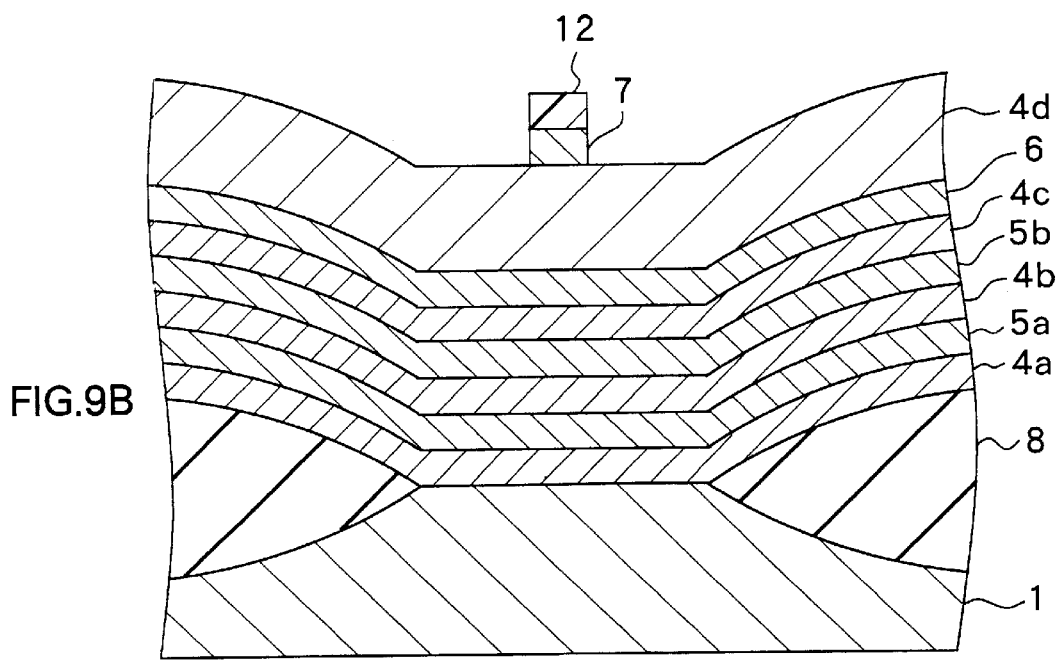

After the gate electrode forming layer 11 is formed, a photoresist film 12 is formed thereon by coating as shown in FIG. 9B. A mask pattern corresponding to the shape of the gate electrode 7 is formed by photolithography. Thereafter, dry etching is conducted by using this photoresist film 12 as a mask and using $SF_6$ (sulfur hexafluoride) or $Cl_2$ (chlorine). By thus removing the gate electrode forming layer 11 selectively, the gate electrode 7 is formed.

Figure 10A:
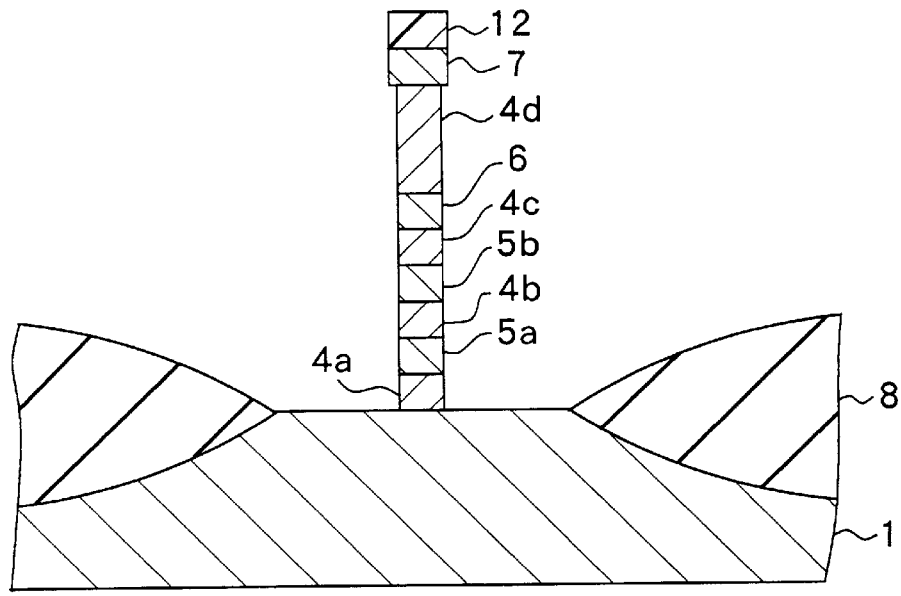
FIGS. 10A and 10B are sectional views showing steps following those of FIGS. 9A and 9B.

After the gate electrode 7 is formed, the barrier layer 4d, charge accumulation layer 6, barrier layer 4c, transition layer 5b, barrier layer 4b, transition layer 5a and barrier layer 4a is selectively removed as shown in FIG. 10A by using the photoresist film 12 as a mask and by RIE (Reactive Ion Etching) which uses, for example, $CF_4$ (carbon tetrafluoride) or $SF_6$ as etching gas, or ECR-RIBE (Reactive Ion Beam Etching) which uses ECR (Electron Cyclotron Resonance). In a direction perpendicular to the direction of stacking, therefore, the barrier layers 4a, 4b, 4c and 4d, the transition layers 5a, 5b and the charge accumulation layer 6 takes the same shape as that of the gate electrode 7. Its size becomes smaller than that of the gate electrode 7 as a whole. Thereafter, the photoresist film 12 is removed.

Figure 10B:
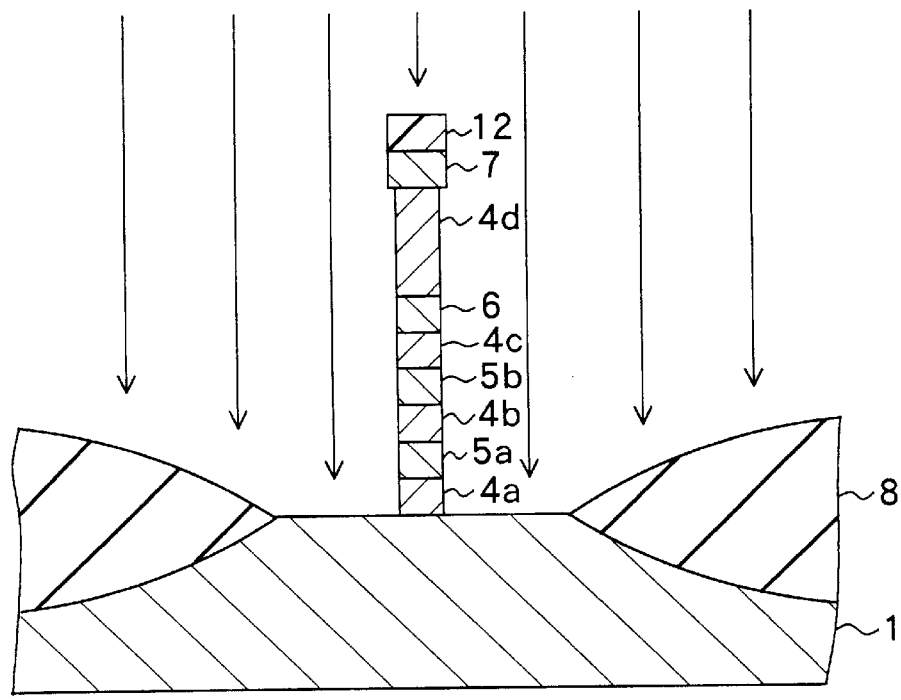

After the photoresist film 12 is removed, impurities such as P (phosphorus) or As (arsenic) are implanted to the surface of the substrate 1 as shown in FIG. 10B by using ion implantation or plasma doping of $PH_3$ (phosphine). This aims at bringing the conduction layer 1a in ohmic contact with the source electrode 2 and the drain electrode 3.

After the impurities are implanted, Al is selectively evaporated by using, for example, the vacuum evaporation method or sputtering method. The source electrode 2 and the drain electrode 3 are thus formed. Thereafter, annealing is conducted at a temperature on the order of 400° C. The source electrode 2 and the drain electrode 3 are thus alloyed with the surface of the substrate 1 (i.e., the conduction layer 1a), and they are brought into ohmic contact. Thereby, the memory device shown in FIGS. 1 and 2 is formed.

For example, in the case where a SOI substrate, a SOS substrate, or a substrate having a polycrystal Si thin film formed on a glass substrate or a plastic substrate is used as the substrate 1, the device isolation portion 8 of this memory device may be formed by selectively removing the Si thin film of the surface of the substrate 1 by means of plasma etching using $SF_6$, $Cl_2$ or $CF_4$, or wet etching using HF (hydrogen fluoride), instead of forming the device isolation portion 8 by using the LOCOS method.

This memory device may also be fabricated by the following method. It is now assumed that an insulative GaAs substrate is used as the substrate 1, the barrier layer 4a, 4b, 4c and 4d is made of n-type AlGaAs mixed crystal, and the transition layer 5a, 5b and the charge accumulation layer 6 is made of GaAs. The method in this case will now be described specifically.

Figure 11A:
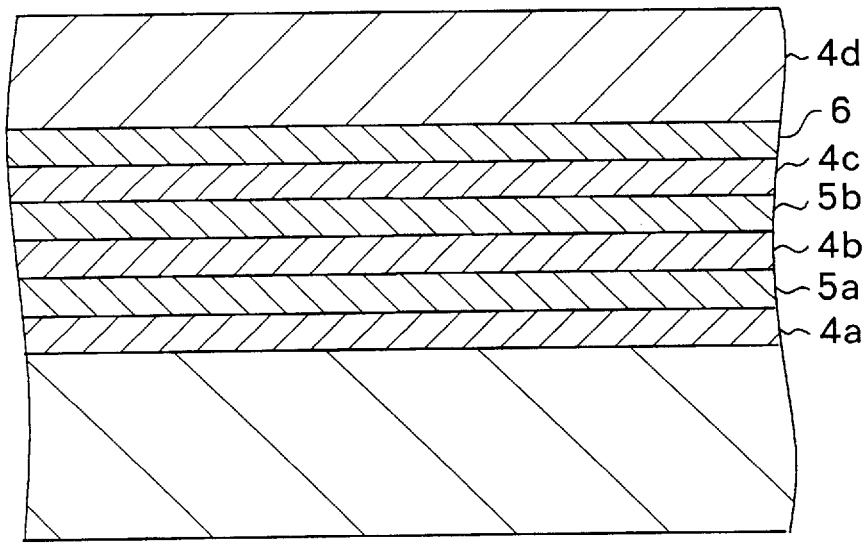
FIGS. 11A and 11B are sectional views showing steps in another fabrication method of the memory device of FIGS. 1 and 2.
Figure 11B:
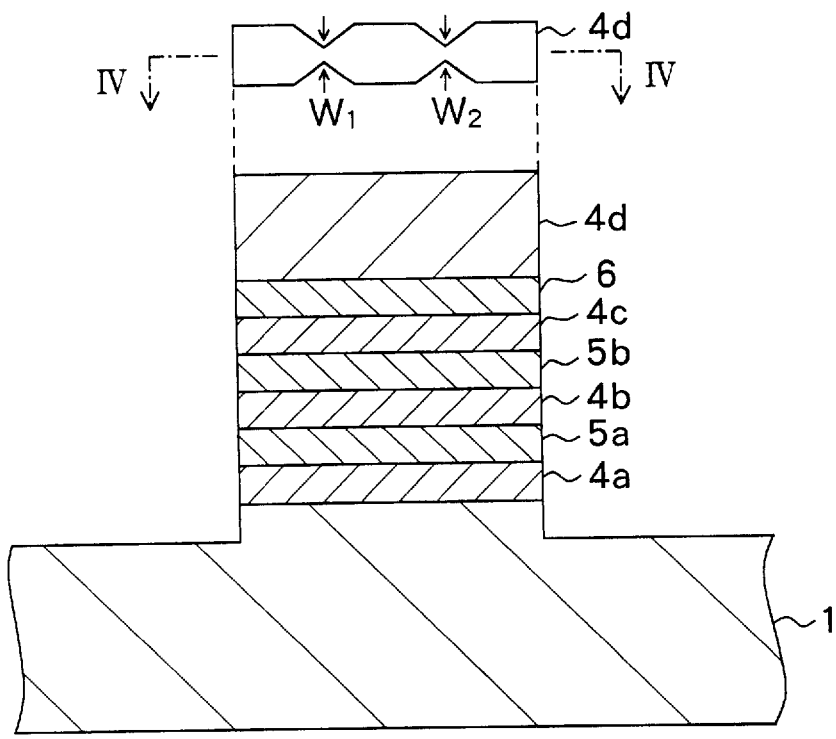
Figure 12A:
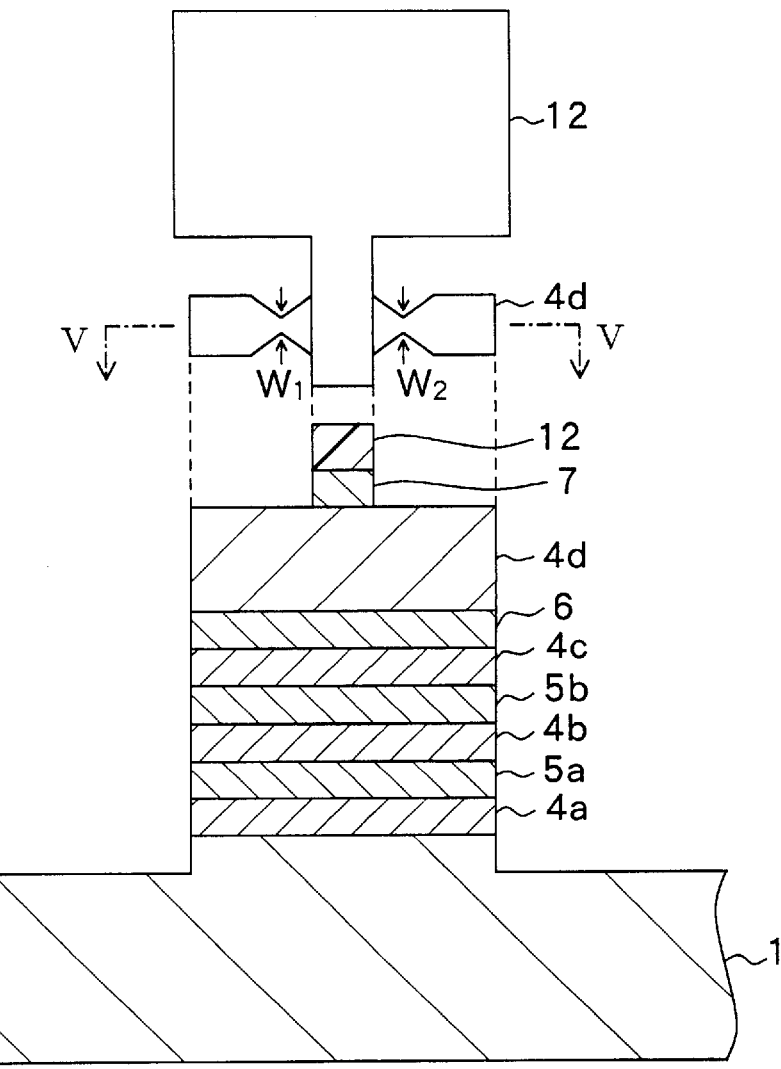
FIGS. 12A and 12B are sectional views showing steps following those of FIGS. 11A and 11B.

FIGS. 11 and 12 show its fabrication steps for the memory device. In FIG. 11B, a top view and a sectional view taken along a line IV—IV thereof are shown together. In FIG. 12A, a top view and a sectional view taken along a line V—V thereof are shown together.

As shown in FIG. 11A, first on a suitable substrate 1 made of insulative GaAs, a barrier layer 4a having a thickness of $d_1$ made of n-type AlGaAs, a transition layer 5a having a suitable thickness made of GaAs, a barrier layer 4b having a thickness of $d_2$ made of n-type AlGaAs, a transition layer 5b having a suitable thickness made of GaAs, a barrier layer 4c having a thickness of $d_3$ made of n-type AlGaAs, a charge accumulation layer 6 having a suitable thickness made of GaAs, and a barrier layer 4d having a thickness $d_4$ made of n-type AlGaAs are stacked one after another by using, for example, the MBE (Molecular Beam Epitaxy) method, the MOCVD (Metal Organic Chemical Vapor Deposition) method or the MOMBE (Metal Organic Molecular Beam Epitaxy) method. Here, the thickness $d_1$, $d_2$, $d_3$ and $d_4$ respectively of the barrier layers 4a, 4b, 4c and 4d has the same value as that of the foregoing fabrication method.

Subsequently, as shown in FIG. 11B, the barrier layer 4d, the charge accumulation layer 6, the barrier layer 4c, the transition layer 5b, the barrier layer 4b, the transition layer 5a, and the barrier layer 4a is selectively removed and device isolation is conducted, for example, by reactive ion etching using $SiCl_4$ (silicon tetrachloride) or $Cl_2$, or reactive ion beam etching. At this time, the width $W_1$ and $W_2$, in the length direction of the gate electrode 7, of portions of the conduction layer forming region subjected to device isolation, respectively corresponding to the insulation portions 1b and 1c is made to become 100 nm or less. In this fabrication method, the device isolation portion 8 as shown in FIG. 2 is not formed.

Subsequently, as shown in FIG. 12A, Al is deposited on the barrier layer 4d and the substrate 1 by using, for example, the sputtering method. A gate electrode forming layer to form a gate electrode 7 is thus formed. Thereafter, a photoresist film 12 is formed thereon in the same way as the foregoing fabrication method. By removing the gate electrode forming layer selectively, the gate electrode 7 is formed.

Figure 12B:
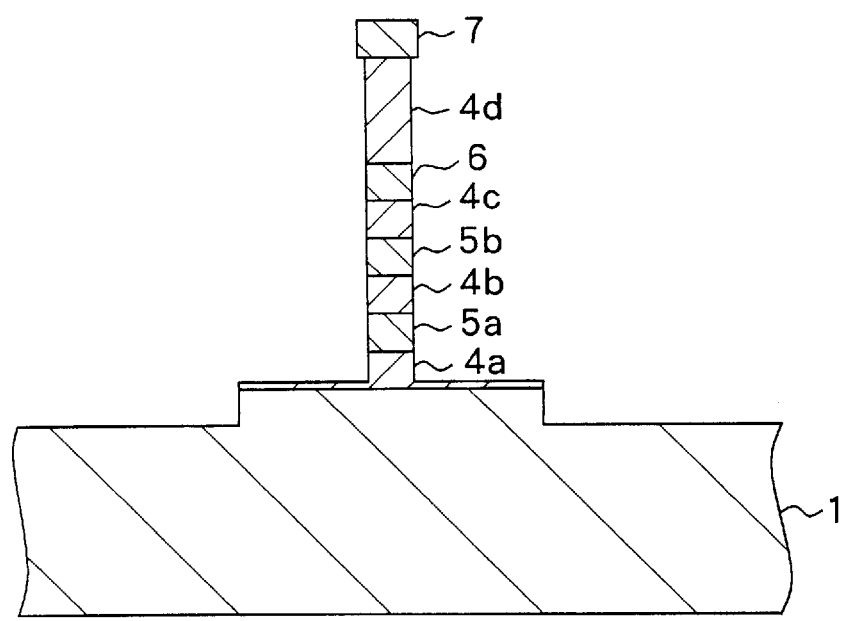

After the gate electrode 7 is formed, the barrier layer 4d, the charge accumulation layer 6, the barrier layer 4c, the transition layer 5b, the barrier layer 4b, the transition layer 5a and the partway of barrier layer 4a is selectively removed as shown in FIG. 12B by using the photoresist film 12 as a mask and by reactive ion etching which uses, for example, $SiCl_4$ or Cl, or reactive ion beam etching. In this case, the widths of the barrier layers 4a, 4b, 4c and 4d, the transition layers 5a, 5b and the charge accumulation layer 6 in a direction perpendicular to the direction of stacking become narrower than that of the gate electrode 7. Thereafter, the photoresist film 12 is removed.

After the photoresist film 12 is removed, impurities such as Si are implanted into such a region that the barrier layer 4a is exposed by using ion implantation. After the ion implantation, for example, AuGe, Ni (nickel), and Au (gold) are selectively evaporated one after another by using the vacuum evaporation method or the sputtering method. The source electrode 2 and the drain electrode 3 are thus formed. Thereafter, annealing is conducted at a temperature on the order of 400° C. The source electrode 2 and the drain electrode 3 are thus brought into ohmic contact with the conduction layer 1a. Thereby, the memory device shown in FIGS. 1 and 2 is formed.

In the case where the barrier layers 4a, 4b, 4c and 4d, the transition layers 5a, 5b and the charge accumulation layer 6 are made of materials having mutually different lattice constants, it is alternatively possible in this memory device to make the transition layers 5a, 5b and the charge accumulation layer 6 become quantum box layers and make the capacitance of the barrier layers 4a, 4b, 4c and 4d become less than a predetermined value by utilizing unevenness caused at the time of stacking even if etching is not conducted. For example, in the case where the barrier layer 4a, 4b, 4c and 4d is made of GaAs and the transition layer 5a, 5b and the charge accumulation layer 6 is made of InGaAs, periodic unevenness is formed on the surface of the transition layer 5a, 5b and the charge accumulation layer 6 when the transition layers 5a, 5b and the charge accumulation layer 6 the made of InGaAs are made to grow. Therefore, the barrier layers 4a, 4b and 4c the made of GaAs should be made to grow so as to fill up the unevenness.

In the memory device according to the present embodiment, the transition layers 5a and 5b are thus provided. Therefore, the charge transition between the conduction layer 1a and the charge accumulation layer 6 can be conducted according to the resonance tunneling. Writing and erasing information can be conducted at extremely high speed and with a low gate voltage Vg. Accordingly, the device can be made finer, and the power dissipation for writing and erasing can be reduced. As a result, a highly integrated memory array can be implemented.

Furthermore, in this memory device, the conduction layer 1a is made to have a plurality of insulation portions 1b and 1c respectively having capacitance $C_{11}$ and $C_{12}$ the smaller than $e^2/k_B T$. Accordingly, the amount of change in the conductivity of the conduction layer 1a which occurs at the same gate voltage caused depending upon whether there are charges accumulated in the charge accumulation layer 6 or not can be made large. Even if the device is made finer, therefore, it can be determined easily whether there are charges accumulated in the charge accumulation layer 6 or not. Accordingly information can be read out easily and accurately.

Furthermore, in the memory device according to the present embodiment, the capacitance $C_{41}$, $C_{42}$ and $C_{43}$ respectively of the barrier layers 4a, 4b and 4c are thus made to become smaller than $e^2/k_B T$. Therefore, it becomes possible to prevent charge transition between the conduction layer 1a and the charge accumulation layer 6 even if a voltage in a predetermined range ($\pm e/2C_{41}$, $\pm e/2C_{42}$ or $\pm e/2C_{43}$) is applied to the gate electrode 7. In other words, even if the voltage varies somewhat, it is possible to prevent charge transition caused thereby and information can be retained accurately. Also when the memory device is used in a memory array, information can be written, erased and retained accurately.

In addition, since the transition layers 5a and 5b are provided in this memory device, the information retaining time can be prolonged by suitably adjusting the number of transition layers. Therefore, it becomes possible to use the memory device as a non-volatile memory.

Second Embodiment

A second embodiment shows a particular example differing from the first embodiment in the materials of the barrier layers 4a, 4b, 4c and 4d, the transition layers 5a, 5b, and the charge accumulation layer 6. Therefore, the same components are denoted by like reference numerals, and detailed description thereof will be omitted here.

Here, the barrier layers 4a, 4b, 4c and 4d are made of a suitable insulator, and the transition layers 5a, 5b and the charge accumulation layer 6 are made of suitable metal. For example, the conduction layer 1a is made of Al (aluminum), the barrier layers 4a, 4b, 4c and 4d are respectively made of $Al_2O_3$ (aluminum oxide), and the transition layers 5a, 5b and the charge accumulation layer 6 is made of Al. Furthermore, the conduction layer 1a may be made of Ti or Ni, the barrier layers 4a, 4b, 4c and 4d may be made of an insulator such as TiOx or NbOx, and the transition layer 5a and 5b may be made of metal such as Ti or Nb.

The memory device having such a configuration operates in the same way as the memory device according to the first embodiment. The present memory device can be fabricated in the same way as the memory device of the first embodiment. The present memory device provides the same effects as those of the memory device of the first embodiment.

Third Embodiment

Figure 13:
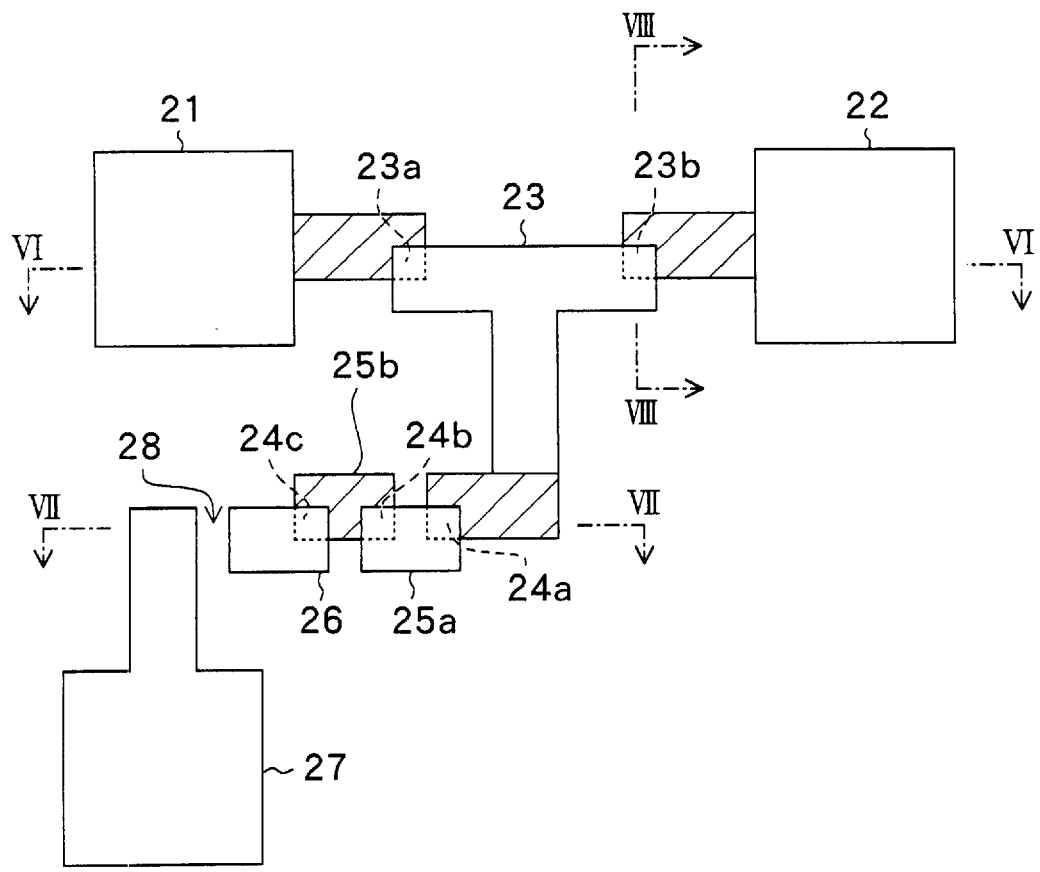
FIG. 13 is a top view showing the configuration of a memory device according to a third embodiment of the present invention.
Figure 14:
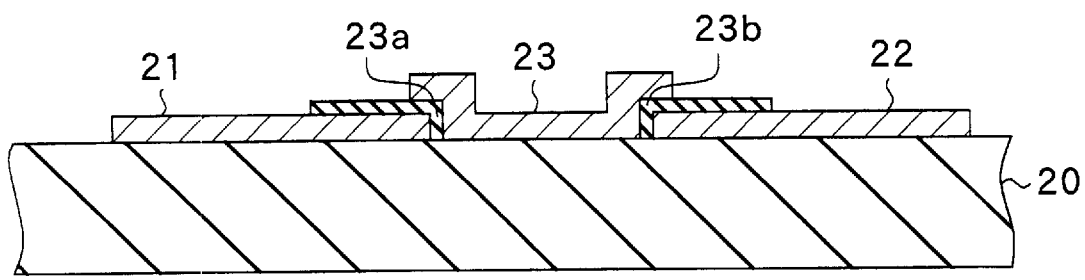
FIG. 14 is a sectional view taken along a line VI—VI showing the configuration of the memory device shown in FIG. 13.
Figure 15:
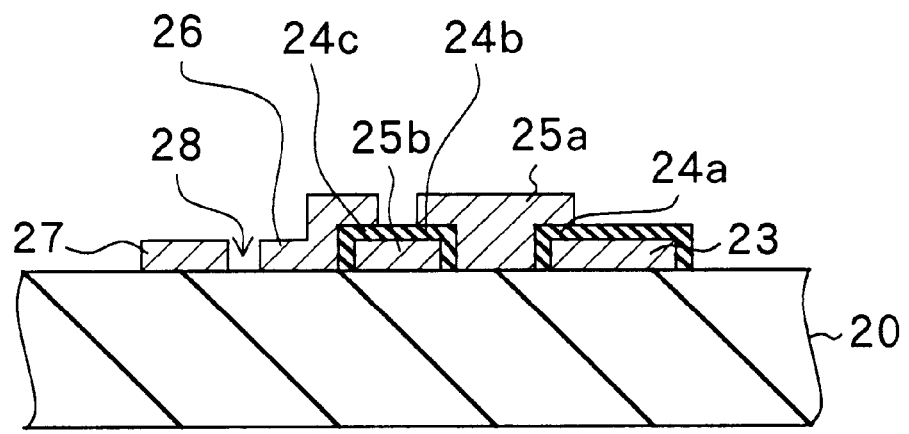
FIG. 15 is a sectional view taken along a line VII—VII showing the configuration of the memory device shown in FIG. 13.

FIG. 13 is a top view of the structure of a memory device according to a third embodiment of the present invention. FIG. 14 is a sectional view of the memory device taken along a line VI—VI shown in FIG. 13. FIG. 15 is a sectional view of the memory device taken along a line VII—VII shown in FIG. 13. In order to facilitate understanding, places where insulation layers 23a and 23b or barrier layers 24a, 24b and 24c are exposed from the surface are shaded in FIG. 13.

In this memory device, a source electrode 21 and a drain electrode 22 the made of suitable metal are formed on a suitable insulative substrate made of, for example, Si, quartz, or sapphire so as to have an interval between them. On the substrate 1 between the source electrode 21 and the drain electrode 22, a conduction layer 23 made of suitable metal is formed. This conduction layer 23 is connected to the source electrode 21 via an insulation layer 23a made of a suitable insulator and serves as an insulation portion. The conduction layer 23 is connected to the drain electrode 22 as well via an insulation layer 23b made of a suitable insulator and serves as an insulation portion. The insulation layer 23a is formed on the source electrode 21. The insulation layer 23b is formed on the drain electrode 22.

The thickness of the insulation layers 23a and 23b (measured between the source electrode 21 or the drain electrode 22 and the conduction layer 23) are respectively set to such a distance that charges can tunnel owing to the quantum tunnel effect. The capacitance $C_{231}$ and $C_{232}$ respectively of the insulation layers 23a and 23b are made smaller than $e^2/k_BT$.

Via a plurality of alternately connected barrier layers serving as barrier portions, and one or more transition layers (here, three barrier layers 24a, 24b and 24c, and two transition layers 25a and 25b), a charge accumulation layer 26 is connected to the conduction layer 23. The transition layer 25a is formed on a substrate 1 so as to partially overlap the barrier layer 24a formed on the conduction layer 23. The transition layer 25b is formed on the substrate 1 so as to be located at a suitable space from the conduction layer 23. On the transition layer 25b, the barrier layers 24b and 24c are formed. A portion of the transition layer 25a overlaps over the barrier layer 24b. The charge accumulation layer 26 is formed on the substrate 1 so as to be located at a suitable space from the transition layer 25a. A portion of the charge accumulation layer 26 overlaps over the barrier layer 24c.

The barrier layers 24a, 24b and 24c are respectively made of a suitable insulator. The transition layers 25a, 25b and the charge accumulation layer 26 are respectively made of suitable metal. For example, Al, Ti or Nb which can be easily oxidized is desirable metal to form conduction layer 23, transition layers 25a, 25b, and charge accumulation layer 26 respectively. As an insulator forming the barrier layers 24a, 24b and 24c, $Al_2O_3$, TiOx, or NiOx is desirable.

The thickness of the barrier layers 24a, 24b and 24c (thickness of a portion sandwiched between two different layers measured between the two layers) are set to such a distance that charges can tunnel owing to the quantum tunnel effect. The capacitance $C_{241}$, $C_{242}$ and $C_{243}$ respectively of the barrier layers 24a, 24b and 24c are made smaller than $e^2/k_BT$.

On the substrate 1 near the charge accumulation layer 26, a gate electrode (control electrode) 27 made of suitable metal is formed at a suitable space from the charge accumulation layer 26. This space between the charge accumulation layer 26 and the gate electrode 27 functions as a barrier portion preventing charge movement.

The memory device having such a configuration can be fabricated as hereafter described.

Figure 16:
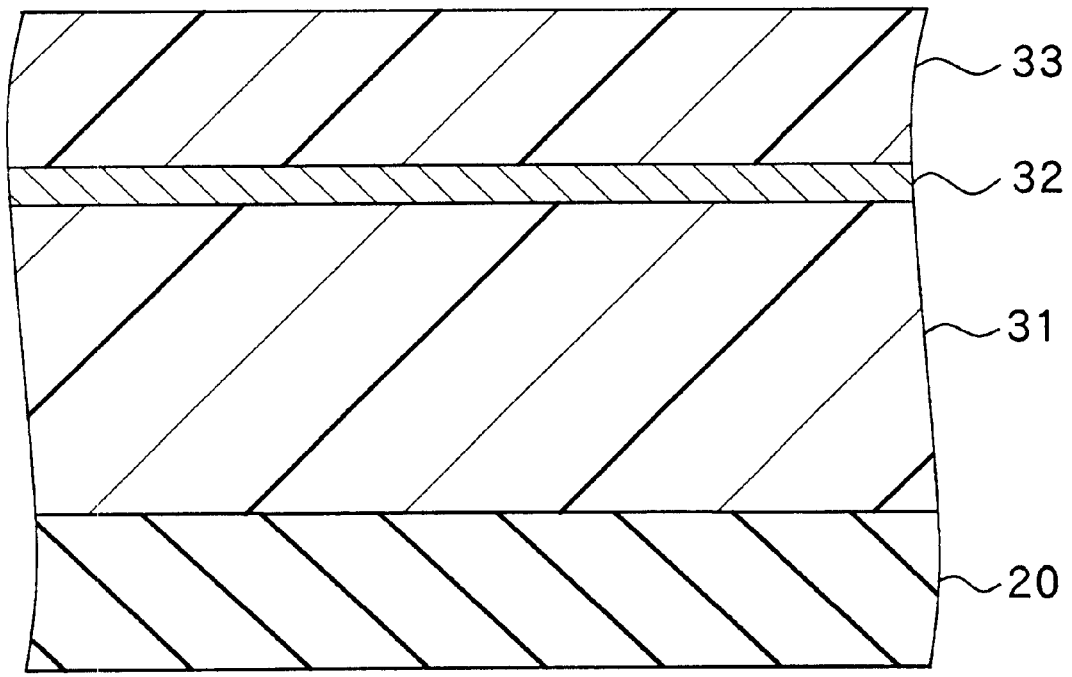
FIG. 16 is a sectional view showing fabrication steps of the memory device shown in FIG. 13.
Figure 17:
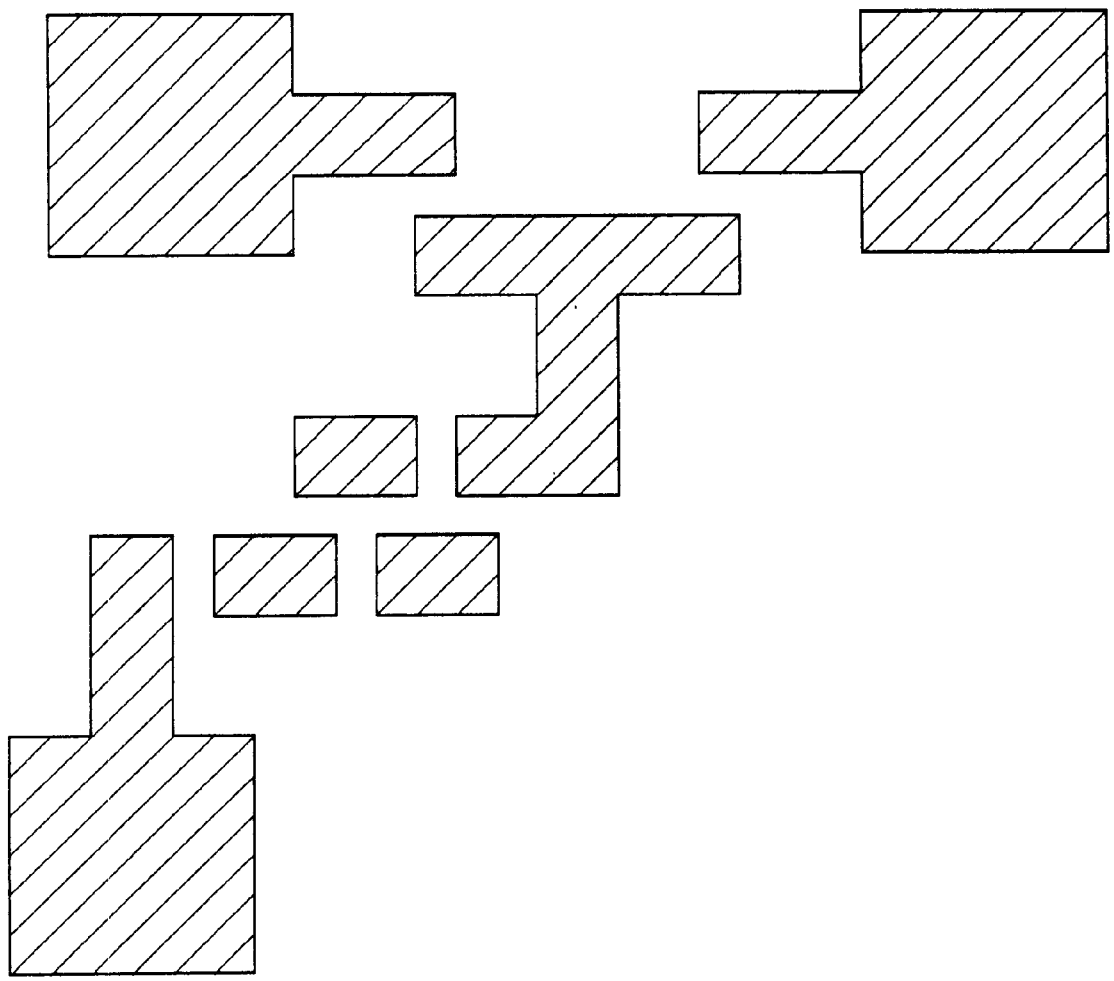
FIG. 17 is a configuration diagram showing a mask pattern to be used when fabricating the memory device shown in FIG. 13.

FIGS. 16 to 19B show fabrication steps of the memory device. FIGS. 16, 18A, 18B, 19A and 19B are sectional views taken along a line VIII—VIII shown in FIG. 13. FIG. 17 shows a mask pattern used in the fabrication steps. In FIG. 17, portions which do not transmit light or an electron beam are shaded.

As shown in FIG. 16, a suitable insulative substrate 20 is first prepared. On the substrate 20, a first photoresist film 31 is formed by coating. Subsequently, Ge is deposited thereon by evaporation to form a Ge layer 32. Furthermore, a second photoresist film 33 is formed thereon by coating.

Figure 18A:
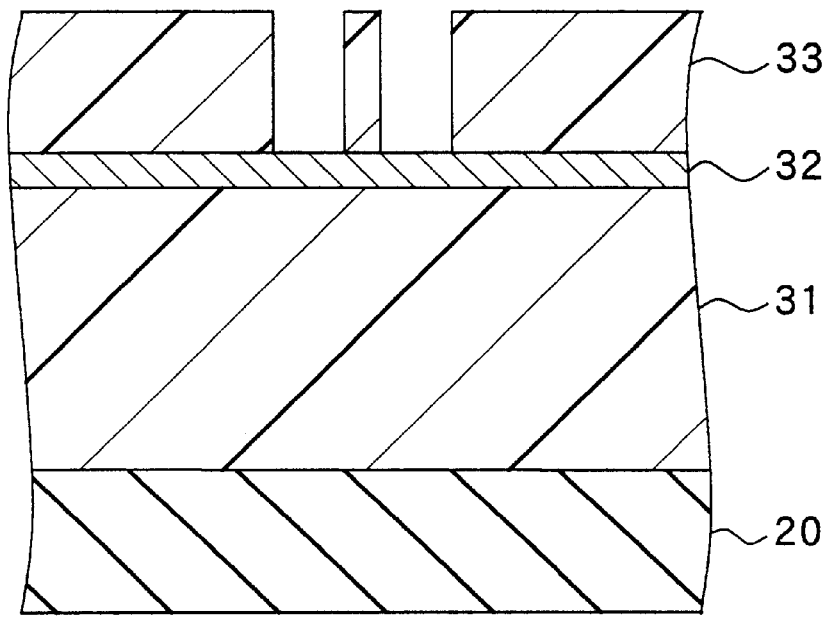
FIGS. 18A and 18B are sectional views showing fabrication steps following those of FIG. 16.

Subsequently, by using the mask pattern as shown in FIG. 17, the second photoresist film 33 is subjected to exposure or electron beam lithography, and then developed. As shown in FIG. 18A, the pattern is transferred to the second photoresist film 33.

Figure 18B:
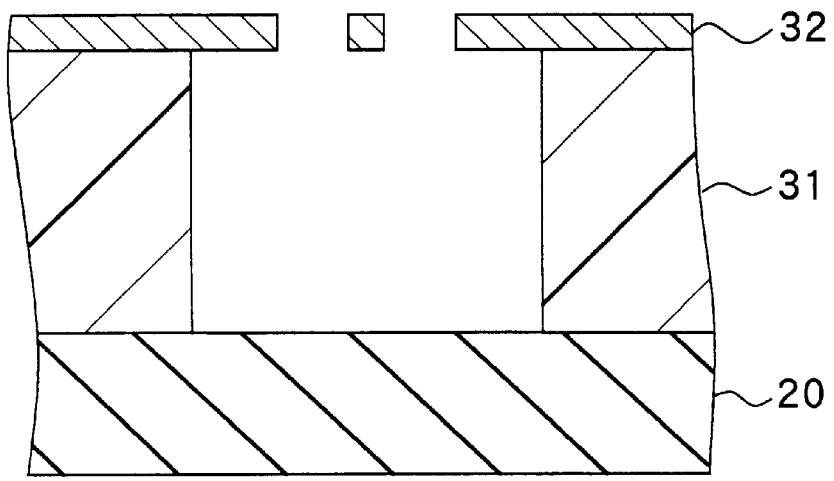

Thereafter, by using the second photoresist film 33 as a mask, the Ge layer 32 is selectively removed by plasma etching using, for example, $SF_6$ as shown in FIG. 18B. In addition, the first photoresist film 31 is partially removed by using the Ge layer as a mask and using, for example, acetone. Simultaneously with the first photoresist film 31, the second photoresist film 33 is also removed.

Figure 19A:
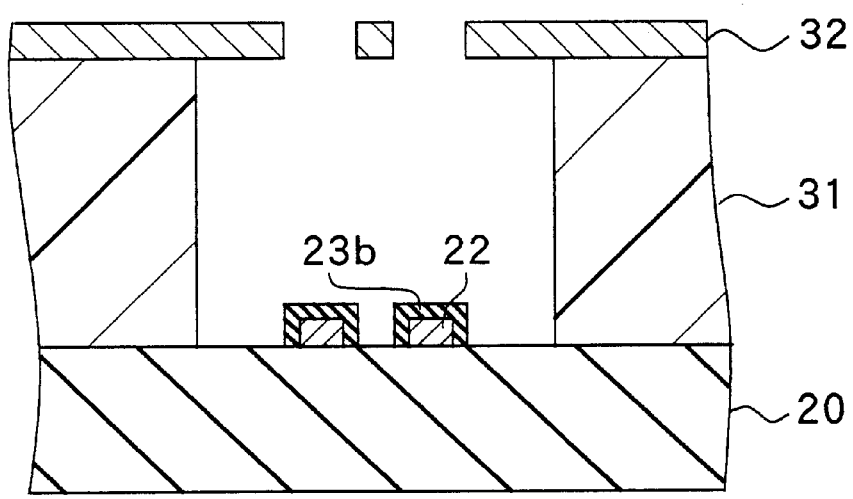
FIGS. 19A and 19B are sectional views showing fabrication steps following those of FIGS. 18A and 18B.

After the first photoresist film 31 is selectively removed, a metal layer made of suitable metal such as Al is deposited on the substrate 20 as shown in FIG. 19A by evaporation and by using the Ge layer 32 as a mask. The source electrode 21, the drain electrode 22, a portion of the conduction layer 23 located on the barrier layer 24a side, and the transition layer 25b are thus formed. Among them, only the drain electrode 22 is shown in FIG. 19A. Thereafter, the surface of the metal layer deposited by evaporation is oxidized in oxygen atmosphere. On the surfaces of the source electrode 21, the drain electrode 22, a portion of the conduction layer 23 located on the barrier layer 24a side, and the transition layer 25b, the barrier layers 24a, 24b and 24c are formed, respectively. Among them, only the insulation layer 23b is shown in FIG. 19A.

Figure 19B:
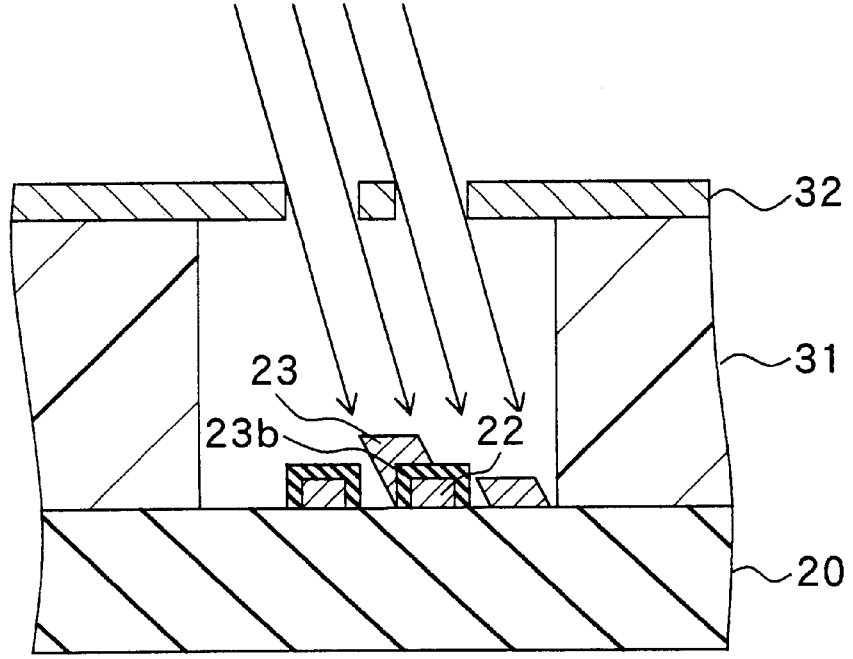

After the oxidation, a metal layer made of suitable metal such as Al is deposited on the substrate 20 as shown in FIG. 19B by evaporation by using the Ge layer as a mask. Portions of the conduction layer 23 located on the source electrode 21 side and the drain electrode 22 side, the transition layer 25a, the charge accumulation layer 26, and the gate electrode 27 are thus formed. At this time, metal is deposited obliquely from above. A portion of the conduction layer 23 is made to overlap the insulation layer 23b located on the drain electrode 22. A portion of the transition layer 25a is made to overlap the barrier layer 24a located on the conduction layer 23. Another portion of the transition layer 25a is made to overlap the barrier layer 24b located on the transition layer 25b. Furthermore, a portion of the charge accumulation layer 26 is made to overlap the barrier layer 24c located on the transition layer 25b. Among them, only the portion of the conduction layer 23 located on the drain electrode 22 side is shown in FIG. 19B.

Thereafter, the Ge layer 32 is removed by plasma etching using, for example, $SF_6$. In addition, the first photoresist film 31 is removed by using, for example, acetone. Thereby, the memory device shown in FIG. 13 is formed.

In this embodiment, the Ge layer was used as the mask layer for etching the first photoresist film 31 and the mask layer for depositing the metal layer which forms various layers such as the drain electrode 22. Instead of the Ge layer, an Al layer made of Al may also be used.

Such a memory device operates in the same way as the memory device according to the first embodiment. The present memory device can be used in the same way as the memory device of the first embodiment. The present memory device provides the same effects as those of the memory device of the first embodiment.

Heretofore, the present invention has been described by referring to the embodiments. However, the present invention is not limited to the above described embodiments, but various changes are possible. For example, in the above described embodiments, the case where electrons convey information has been described. In the present invention, however, holes may convey the information. Operation in that case is nearly the same except that electrons in the above described embodiments are replaced by holes.

In the above described embodiments, the case where the transition layers 5a and 5b, or 25a and 25b with double layers have been described specifically. However, the number of transition layers need only to be at least one. Furthermore, three or more transition layers may also be provided. For example, if the number of barrier layers the in contact with a transition layer (the number of barrier layers through which the charge can tunnel) is n, the capacitance respectively of the barrier layers is $C_{4i}$ (where i=1, 2, ..., n, the same will apply hereinafter), and the resistance respectively of the barrier layers is $R_4i$, then the gate voltage $V_g$ required to write or erase information is $\pm e/2C_{4i}$. At a voltage in this range, charge transition does not occur between the charge accumulation layer 1a or 23 and the charge accumulation layer 6 or 26. Furthermore, time required for writing and erasing is $(R_{41}+R_{42}+...+R_{4n})Cg$, and the information retaining time is $R_K (R_{41}/R_K) (R_{42}/R_K) ... (R_{4n}/R_K) Cg$. In the same way as the above described embodiments, Cg is a capacitance of the barrier layer (barrier portion) located between the gate electrode 7 or 27 and the charge accumulation layer 6 or 26.

If, in the case where four transition layers and five barrier layers allowing charges to tunnel are formed, the tunnel resistance $R_i$ of the barrier layer is $1 \times 10^9$ Ω and the capacitance Cg of the barrier layer between the gate electrode 7 or 27 and the charge accumulation layer 6 or 26 is $1 \times 10^{-18}$ F, then the time required for writing and erasing becomes $(R_{41}+R_{42}+R_{43}+R_{44}+R_{45})Cg=5R_4iCg=5\times10^9\times10^{-18}=5$ ns. The information retaining time becomes $R_K (R_{41}/R_K) (R_{42}/R_K) (R_{43}/R_K) (R_{44}/R_K) (R_{45}/R_K) Cg=R_K (R_4i/R_K)^5 Cg=13\times10^3\times(10^9/(13\times10^3))^5\times10^{-18} \approx 3.5\times10^{10}$.

If the number of the transition layers is increased, the charge retaining time in the charge accumulation layer 6 or 26 can be prolonged. Therefore, it is favorable as a non-volatile memory. If in this example as well four transition layers are formed as well, then the information retaining time can be made approximately equal to $3.5\times10^{10}$ s, and the memory device can be used practically as a non-volatile memory. However, this is a value obtained when the temperature is absolute zero degree. At a temperature in use, therefore, the information retaining time becomes shorter than this value.

Furthermore, the embodiments have been described by referring to particular examples for the case where the conduction layer 1a or 23, the transition layers 5a and 5b, or 25a and 25b, and the charge accumulation layer 6 or 26 are made of the same first material, and the barrier layers 4a, 4b, 4c and 4d or 24a, 24b and 24c are made of the same second material. They may be made of different materials, respectively.

In addition, in the above described embodiments, a particular fabrication method of the memory device has been described by referring to an example. The memory device can also be fabricated by using different methods.

In the memory device of the present invention as heretofore described, at least one transition layer is provided. Therefore, the charge transition between the conduction layer and the charge accumulation layer can be conducted via a transition layer. Writing and erasing information can be conducted at extremely high speed and with a low voltage. Accordingly, the device can be made finer, and the power dissipation for writing and erasing can be reduced. Such effects can be obtained.

Furthermore, in the memory device of the present invention, the conduction layer is made to have a plurality of insulation portions. Therefore, the amount of change in the conductivity of the conduction layer caused depending upon whether there are charges accumulated in the charge accumulation layer can be made large. Even if the device is made finer, therefore, it can be determined easily whether there are charges accumulated in the charge accumulation layer or not. Thus, information can be read out easily and accurately. Such effects can also be obtained.

Furthermore, in the memory device of the present invention, the capacitance respectively of barrier portions located between a transition layer and the conduction layer, in between each transition layer, and between a transition layer and the charge accumulation layer are made smaller than $e^2/k_B T$. Therefore, it becomes possible to prevent charge transition between the conduction layer and the charge accumulation layer even if a voltage in a predetermined range is applied in between. Even if the voltage varies somewhat, therefore, it is possible to prevent charge transition caused thereby, and information can be retained accurately. Such effects can also be obtained.

In addition, in a memory array of the present invention, the memory devices of the present invention are used. Therefore, high integration can be attained and the power dissipation can be reduced. Even if the memory array is implemented in an integrated form, information can be read out easily and accurately. Such effects can also be obtained.

What is claimed is:

1. A memory device comprising:

a conduction layer having a plurality of insulation portions allowing charge tunneling;

a charge accumulation layer for accumulating charges transferred from the conduction layer;

one or more transition layers for transferring charges from the conduction layer to the charge accumulation layer and the conduction layer; and a plurality of barrier portions allowing charge tunneling, being respectively formed between one of the transition layers and the conduction layer, in between the transition layers, and between one of the transition layers and the charge accumulation layer, wherein, each of the insulation portions of the conduction layer has a capacitance smaller than $e^2/k_B T$, where e is the electric prime quantity, $k_B$ is the Boltzman's constant, and T is operation temperature.

2. A memory device according to claim 1, wherein each of the barrier portions has a capacitance smaller than $e^2/k_B T$, where e is the electric prime quantity, $k_B$ is the Boltzmann's constant, and T is operation temperature.

3. A memory device according to claim 1, wherein the conduction layer, the transition layers, and the charge accumulation layer are respectively made of a semiconductor;

the barrier portion located between the conduction layer and the transition layer has a barrier layer made of a semiconductor which is smaller in electron affinity or larger in work function than the semiconductor of the conduction layer and the semiconductor of the transition layer;

the barrier portion located between the transition layers has a barrier layer made of a semiconductor which is smaller in electron affinity or larger in work function than the semiconductors of the transition layers; and the barrier portion located between the transition layer and the charge accumulation layer has a barrier layer made of a semiconductor which is smaller in electron affinity or larger in work function than the semiconductor of the transition layer and the semiconductor of the charge accumulation layer.

4. A memory device according to claim 3, wherein the conduction layer, the transition layers, and the charge accumulation layer is respectively made of Si; and the barrier layers serving as barrier portions are respectively made of $SiO_2$, $Si_3N_4$, or SiON.

5. A memory device according to claim 3, wherein the conduction layer, the transition layers, and the charge accumulation layer are respectively made of SiGe and Ge; and each of the barrier layers serving as barrier portions is made of SiGe, Si, $SiO_2$, $Si_3N_4$, or SiON.

6. A memory device according to claim 3, wherein the conduction layer, the transition layers, and the charge accumulation layer are respectively made of a Group III–V compound semiconductor including at least one element selected from the group consisting of In and Ga of the Group III element and As of the Group V element; and each of the barrier layers serving as barrier portions is made of a Group III–V compound semiconductor including at least one element selected from the group consisting of In, Al and Ga of the Group III element and As of the Group V element.

7. A memory device according to claim 3, wherein the conduction layer, the transition layer, and the charge accumulation layer are respectively made of a Group III–V compound semiconductor including at least one element selected from the group consisting of In and Ga of the Group III element and Sb of the Group V element; and each of the barrier layers serving as barrier portions is made of a Group III–V compound semiconductor including at least one element selected from the group consisting of In, Al and Ga of the Group III element and Sb of the Group V element.

8. A memory device according to claim 1, wherein the conduction layer is made of a semiconductor;

the transition layers and the charge accumulation layer are made of metal; and each of the barrier portions is formed by a barrier layer made of an insulator.

9. A memory device according to claim 8, wherein the transition layer and the charge accumulation layer are respectively made of Al; and each of the barrier layers serving as barrier portions is made of $Al_2O_3$.

10. A memory device according to claim 1, wherein the conduction layer is made of metal;

each of the insulation portions of the conduction layer is formed by an insulation layer made of an insulator;

the transition layers and the charge accumulation layer are made of metal;

each of the barrier portions is formed by a barrier layer made of an insulator.

11. A memory device according to claim 10, wherein the conduction layer, the transition layers, and the charge accumulation layer are respectively made of Al; and each of the insulation layers serving as insulation portions of the conduction layer is made of $Al_2O_3$.

12. A memory array formed by integrating a plurality of memory devices, each of the memory devices comprising:

a conduction layer having a plurality of insulation portions allowing charge tunneling;

a charge accumulation layer for accumulating charges transferred from the conduction layer;

one or more transition layers for transferring charges from the conduction layer to the charge accumulation layer and the conduction layer; and a plurality of barrier portions allowing charge tunneling, being respectively formed between one of the transition layers and the conduction layer, in between the transition layers, and between one of the transition layers and the charge accumulation layer, wherein, each of the insulation portions of the conduction layer has a capacitance smaller than $e^2/k_B T$, where e is the electric prime quantity, $k_B$ is the Boltzman's constant, and T is operation temperature.

* * * * *